(12) United States Patent
Toi et al.

(10) Patent No.: US 9,292,284 B2
(45) Date of Patent: Mar. 22, 2016

(54) PARALLEL ARITHMETIC DEVICE, DATA PROCESSING SYSTEM WITH PARALLEL ARITHMETIC DEVICE, AND DATA PROCESSING PROGRAM

(71) Applicant: Renesas Electronics Corporation, Kawasaki-shi, Kanagawa (JP)

(72) Inventors: Takao Toi, Kanagawa (JP); Taro Fujii, Kanagawa (JP); Yoshinosuke Kato, Kanagawa (JP); Toshiro Kitaoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 405 days.

(21) Appl. No.: 13/935,790

(22) Filed: Jul. 5, 2013

(65) Prior Publication Data
US 2014/0019726 A1 Jan. 16, 2014

(30) Foreign Application Priority Data

Jul. 10, 2012 (JP) ................................ 2012-154903

(51) Int. Cl.
*G06F 15/76* (2006.01)
*G06F 9/44* (2006.01)
*G06F 9/30* (2006.01)
*G06F 9/38* (2006.01)
(Continued)

(52) U.S. Cl.
CPC ............ *G06F 9/3001* (2013.01); *G06F 9/3887* (2013.01); *G06F 17/505* (2013.01); *G06F 17/5054* (2013.01); *G06F 15/7867* (2013.01); *Y02B 60/1207* (2013.01); *Y02B 60/1225* (2013.01)

(58) Field of Classification Search
CPC .... G06F 9/3836; G06F 9/3001; G06F 9/3828
See application file for complete search history.

(56) References Cited

U.S. PATENT DOCUMENTS 6,574,724 B1 * 6/2003 Hoyle ................. G06F 9/30181
711/200
6,993,756 B2 1/2006 Ogawa et al.
(Continued)

FOREIGN PATENT DOCUMENTS

JP 04-293150 A 10/1992
JP 2001-249818 A 9/2001
(Continued)

OTHER PUBLICATIONS

Office Action issued by Japanese Patent Office in Japanese Application No. 2012-154903 mailed Dec. 1, 2015.
(Continued)

*Primary Examiner* — Hyun Nam
(74) *Attorney, Agent, or Firm* — Sughrue Mion, PLLC

(57) ABSTRACT

A parallel arithmetic device includes a status management section, a plurality of processor elements, and a plurality of switch elements for determining the relation of coupling of each of the processor elements. Each of the processor elements includes an instruction memory for memorizing a plurality of operation instructions corresponding respectively to a plurality of contexts so that an operation instruction corresponding to the context selected by the status management section is read out, and a plurality of arithmetic units for performing arithmetic processes in parallel on a plurality of sets of input data in a manner compliant with the operation instruction read out from the instruction memory.

12 Claims, 21 Drawing Sheets

(51) Int. Cl.
*G06F 17/50* (2006.01)
*G06F 15/78* (2006.01)

(56) References Cited

U.S. PATENT DOCUMENTS

| | | |
|---|---|---|
| 7,103,720 B1 | 9/2006 | Moy et al. |
| 7,120,903 B2 | 10/2006 | Toi et al. |
| 7,761,693 B2 | 7/2010 | Symes et al. |
| 8,078,835 B2 | 12/2011 | Yang et al. |
| 2003/0046513 A1* | 3/2003 | Furuta ............... G06F 15/8023 712/15 |
| 2003/0126404 A1 | 7/2003 | Anjo et al. |
| 2005/0141784 A1* | 6/2005 | Ferriz ............... G06T 3/4023 382/298 |
| 2006/0236075 A1 | 10/2006 | Hara |
| 2008/0127065 A1* | 5/2008 | Bryant ............... G05B 19/056 717/109 |
| 2015/0310311 A1* | 10/2015 | Shi ............... G06N 3/0454 382/158 |

FOREIGN PATENT DOCUMENTS

| | | |
|---|---|---|
| JP | 2006-260479 A | 9/2006 |
| JP | 3861898 B2 | 12/2006 |
| JP | 3921367 B2 | 5/2007 |
| JP | 4292197 B2 | 7/2009 |
| JP | 2010-539582 A | 12/2010 |
| JP | 4699002 B2 | 6/2011 |

OTHER PUBLICATIONS

Toru Awashima et al., "C Compiler for Dynamically Reconfigurable Processor: DRP", The Institute of Electronics, Information and Communication Engineers, Technical Report of IEICE, vol. 103 No. 580, Jan. 2004.

* cited by examiner

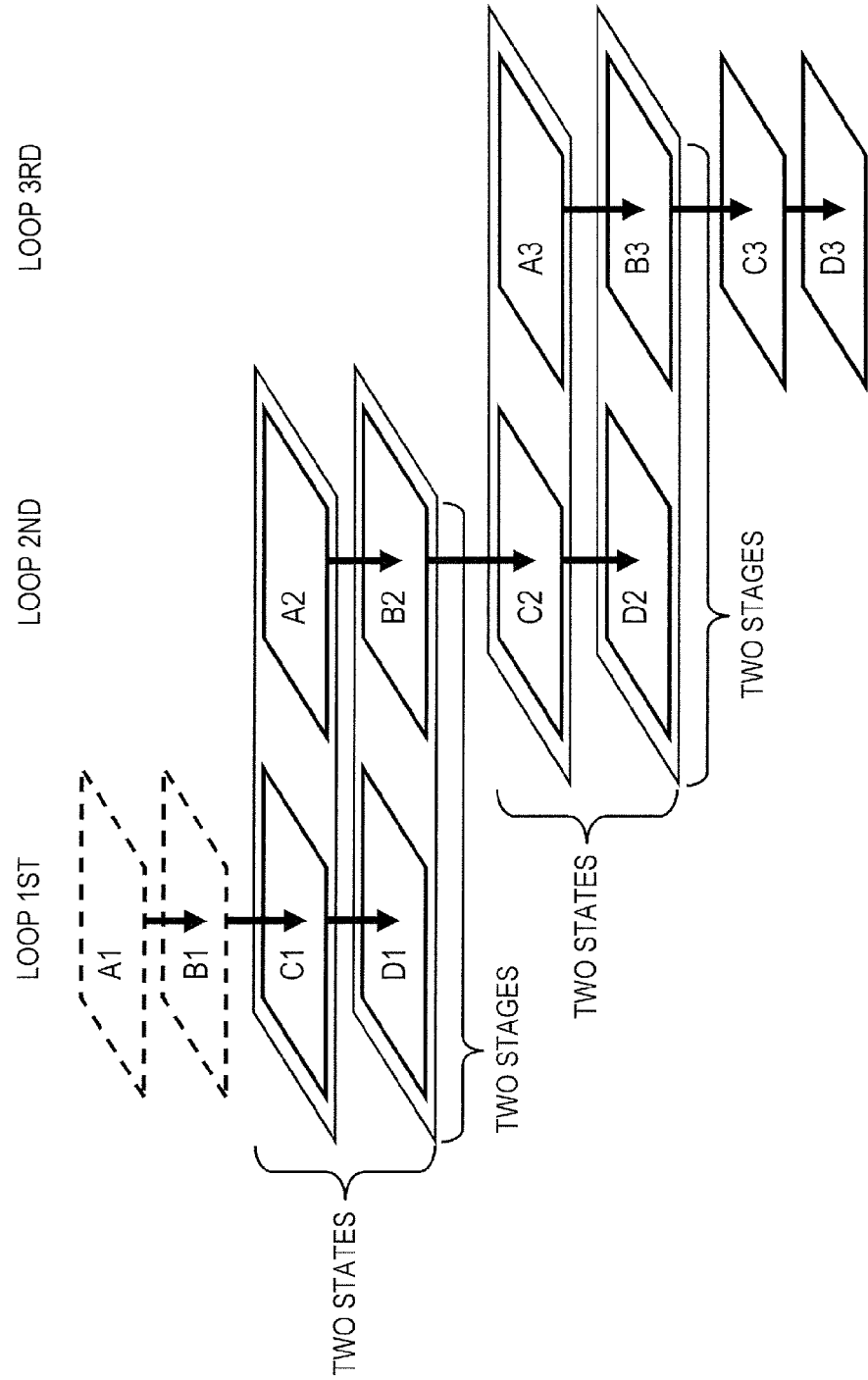

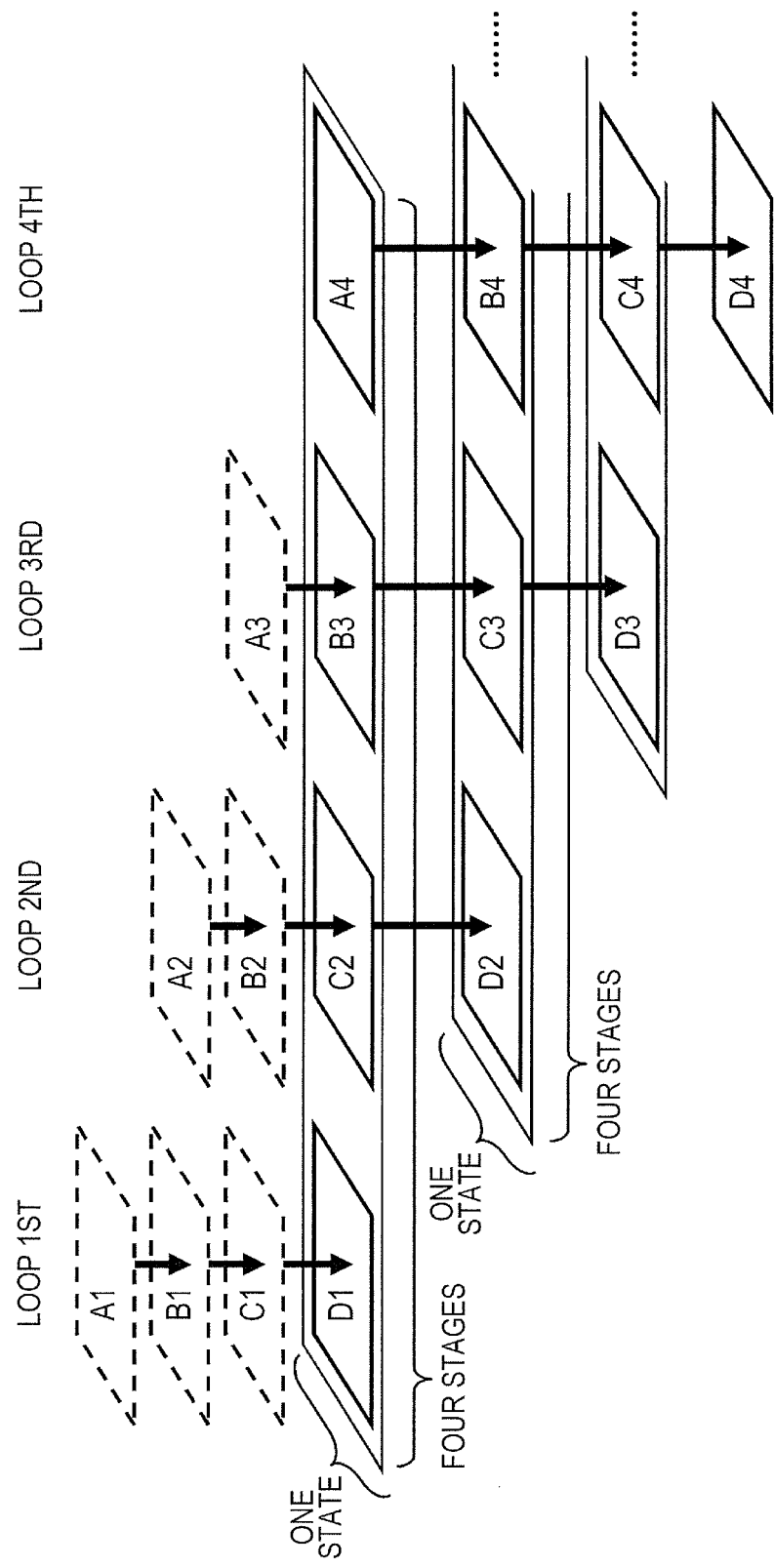

FIG. 12

```
/* OUTER LOOP */
for (j=0; j<400; j++) {          ············|········UNROLLING OF OUTER LOOP
    /* INNER LOOP */
    for (i=0; i<100; i++) {      ············|········PIPELINING OF INNER LOOP
        x[j][i] = a[j][i] + b[j][i];
    }
}
```

FIG. 13

```
/* OUTER LOOP */
for (n=0; n<50; n++) {
    for (m=0; m<8; m++) {
        j = n*50 + m;
        /* INNER LOOP */
        for (i=0; i<100; i++) {
            x[j][i] = a[j][i] + b[j][i];
        }
    }
}
```

⋯⋯ LOOP DESCRIPTION B
⋯⋯ LOOP DESCRIPTION a

DIVIDING INTO LOOP DESCRIPTION A HAVING EIGHT LOOP PROCESSES
AND LOOP DESCRIPTION B HAVING FIFTY LOOP PROCESSES

FIG. 14

```
/* OUTER LOOP */
for (n=0; n<50; n++) {
    k = n*50;
    /* INNER LOOP */
    for (i=0; i<100; i++) {
        /* PROCESS PERFORMED WHEN m = 0 */
        x[k+0][i] = a[k+0][i] + b[k+0][i];
        /* PROCESS PERFORMED WHEN m = 1 */
        x[k+1][i] = a[k+1][i] + b[k+1][i];
        ...
        /* PROCESS PERFORMED WHEN m = 7 */
        x[k+7][i] = a[k+7][i] + b[k+7][i];
    }
}
```

⎫
⎬ UNROLLING OF LOOP DESCRIPTION A HAVING EIGHT LOOP PROCESSES
⎭

FIG. 15

```
/* OUTER LOOP */
for (n=0; n<50; n++) {
  /* INNER LOOP */
  for (i=0; i<100; i++) {
    X[n][i] = VADD (A[n][i], B[n][i]);
  }
}
```

EIGHT SCALAR DATA IS CONSOLIDATED INTO ONE VECTOR DATA AND SCALAR ADDITION IS SUBSTITUTED BY VECTOR ADDITION

FIG. 18

| | 0 | 1 | 2 | 3 | 4 | 5 | 6 | 7 |
|---|---|---|---|---|---|---|---|---|
| x = z - k; | EXECUTION | EXECUTION | EXECUTION | EXECUTION | EXECUTION | EXECUTION | EXECUTION | EXECUTION |
| if(c==d) { | TRUE | FALSE | TRUE | TRUE | TRUE | FALSE | FALSE | TRUE |
| x += a; | EXECUTION | — | EXECUTION | EXECUTION | EXECUTION | — | — | EXECUTION |
| } else { | FALSE | TRUE | FALSE | FALSE | FALSE | TRUE | TRUE | FALSE |
| x = b + 1; | — | EXECUTION | — | — | — | EXECUTION | EXECUTION | — |
| } | | | | | | | | |

PARALLEL ARITHMETIC DEVICE, DATA PROCESSING SYSTEM WITH PARALLEL ARITHMETIC DEVICE, AND DATA PROCESSING PROGRAM

CROSS-REFERENCE TO RELATED APPLICATIONS

The disclosure of Japanese Patent Application No. 2012-154903 filed on Jul. 10, 2012 including the specification, drawings, and abstract is incorporated herein by reference in its entirety.

BACKGROUND

The present invention relates to a parallel arithmetic device, a data processing system with the parallel arithmetic device, and a computer-readable medium storing a data processing program.

A coarse-grained dynamically reconfigurable processor (parallel arithmetic device or array-type processor) forms a circuit by dynamically changing the processing of each of a plurality of processor elements and the relation of coupling therebetween in accordance with an externally input object code. Hence, the dynamically reconfigurable processor can reuse circuit resources to perform a complicated arithmetic process with a small-scale circuit. An exemplary configuration of the dynamically reconfigurable processor is disclosed, for instance, in Japanese Patents Nos. 3921367 and 3861898.

A single-instruction multiple-data (SIMD) processor, which performs a plurality of arithmetic processes in parallel upon receipt of a single-operation instruction, is disclosed in Japanese Patents Nos. 4292197 and 4699002 and in Japanese Unexamined Patent Application Publication (Translation of PCT Application) No. 2010-539582.

SUMMARY

When processing a plurality of sets of data in a parallel manner, a related-art dynamically reconfigurable processor (parallel arithmetic device or array-type processor) has to not only issue an operation instruction about processing to each of a plurality of processor elements, which correspond to the sets of data, but also issue an operation instruction about the relation of coupling to each of a plurality of switch elements that determine the relation of coupling between the processor elements. This also holds true for the case where a circuit corresponding to an unrolled part of a loop description is dynamically configured. Hence, the related-art dynamically reconfigurable processor has to store in memory an enormous number of instructions about the processing of each of the processor elements and about the relation of coupling therebetween. Consequently, the related-art dynamically reconfigurable processor cannot efficiently use circuit resources.

Other problems and novel features will become apparent from the following description and from the accompanying drawings.

According to an aspect of the present invention, there is provided a parallel arithmetic device including a status management section, a plurality of processor elements, and a plurality of switch elements that determine the relation of coupling of each of the processor elements. The processor elements each include an instruction memory and a plurality of arithmetic units. The instruction memory memorizes a plurality of operation instructions corresponding respectively to a plurality of contexts so that an operation instruction corresponding to a context selected by the status management section is read out. The arithmetic units perform parallel arithmetic processes on a plurality of sets of input data in a manner compliant with the operation instruction read out from the instruction memory.

According to another aspect of the present invention, there is provided a computer-readable medium storing a data processing program for supplying circuit data to a parallel arithmetic device that includes a status management section, a plurality of processor elements, and a plurality of switch elements that determine the relation of coupling of each of the processor elements. The processor elements each include an instruction memory and a plurality of arithmetic units. The instruction memory memorizes a plurality of operation instructions corresponding to each of a plurality of contexts so that an operation instruction corresponding to a context selected by the status management section is read out. The arithmetic units perform parallel arithmetic processing on each of a plurality of sets of input data in a manner compliant with the operation instruction read out from the instruction memory. The data processing program causes a computer to perform a behavioral synthesis process and a layout process. The behavioral synthesis process is performed to generate a structural description by unrolling, for behavioral synthesis purposes, a loop description that is included in an operation description and with no data dependency between iterations. The layout process is performed to generate the circuit data by subjecting the structural description to logic synthesis and performing a place and route.

The above aspects of the present invention make it possible to provide a parallel arithmetic device capable of efficiently using circuit resources.

BRIEF DESCRIPTION OF THE DRAWINGS

Embodiments of the present invention will be described in detail based on the following figures, in which:

FIG. 5B is a conceptual diagram illustrating a pipelining scheme;

FIG. 5C is a conceptual diagram illustrating a pipelining scheme;

FIG. 12 is a diagram illustrating an example of a loop description;

FIG. 13 is a diagram illustrating how a SIMD instruction is assigned by the behavioral synthesis section according to a fourth embodiment of the present invention;

FIG. 14 is a diagram illustrating how the SIMD instruction is assigned by the behavioral synthesis section according to the fourth embodiment;

FIG. 15 is a diagram illustrating how the SIMD instruction is assigned by the behavioral synthesis section according to the fourth embodiment;

FIG. 18 is a diagram illustrating how a conditional branch is executed by a related-art SIMD processor.

DETAILED DESCRIPTION

Figure 1:
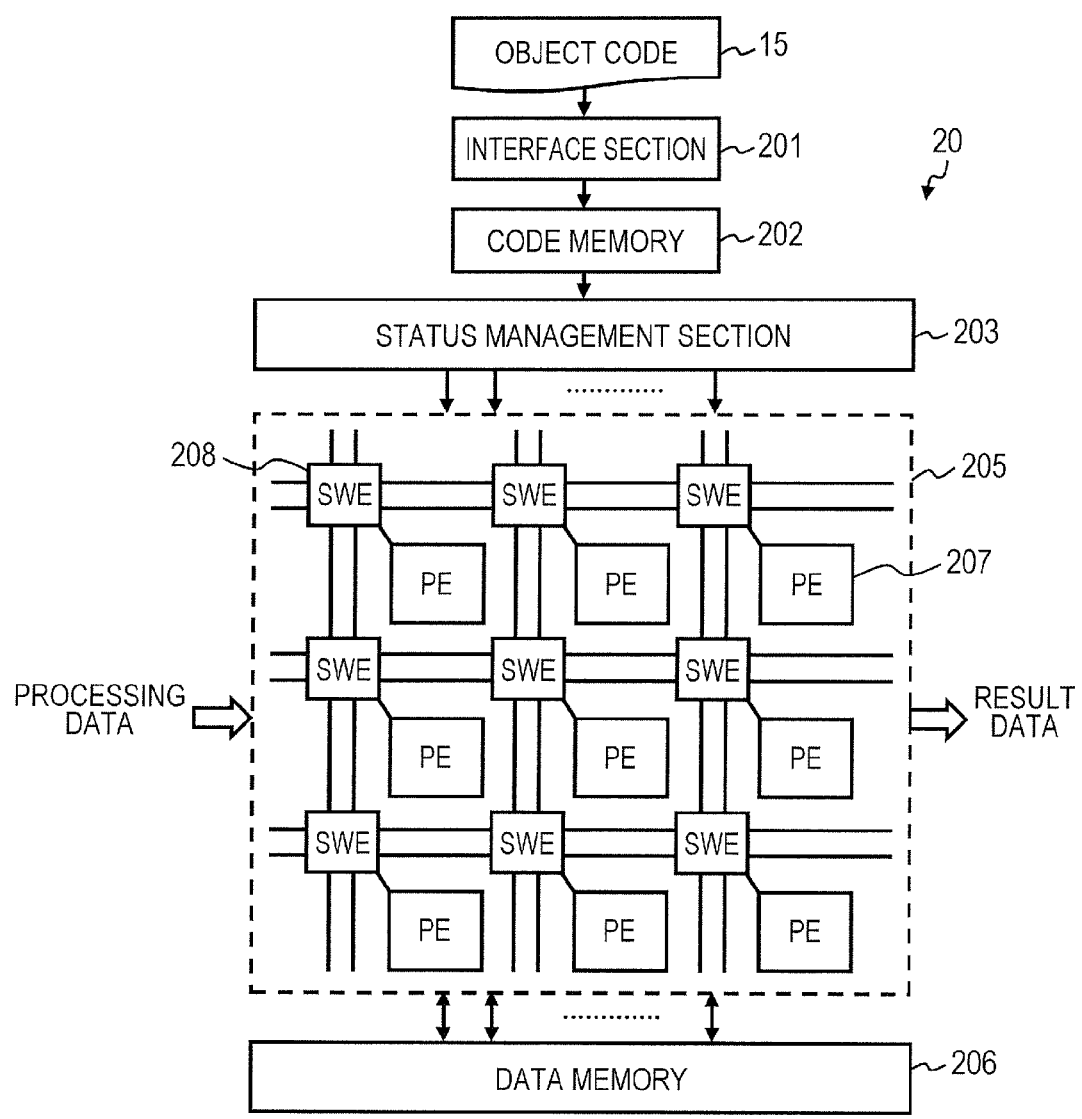
FIG. 1 is a diagram illustrating an exemplary configuration of an array-type processor according to a first embodiment of the present invention.

Embodiments of the present invention will now be described with reference to the accompanying drawings. As the drawings are simplified, they should not be used to narrowly interpret the technical scope of each embodiment. Like elements are designated by like reference numerals and will not be redundantly described.

In the following description of the embodiments, if necessary for convenience sake, a description of the present invention will be given in a divided manner in plural sections or embodiments, but unless specifically stated, they are not unrelated to each other, but are in such a relation that one is a modification, an application, a detailed explanation, or a supplementary explanation of a part or the whole of the other. Also, in the embodiments described below, when referring to the number of elements (including the number of pieces, numerical values, amounts, ranges, and the like), the number of elements is not limited to a specific number unless specifically stated or except the case where the number is apparently limited to a specific number in principle. The number larger or smaller than the specified number is also applicable.

Further, in the embodiments described below, their components (including operating steps and the like) are not always indispensable unless specifically stated or except the case where the components are apparently indispensable in principle. Similarly, in the embodiments described below, when the shape of the components, the positional relationship therebetween, and the like are mentioned, the substantially approximate and similar shapes and the like are included therein unless specifically stated or except the case where it is conceivable that they are apparently excluded in principle. The same goes for the aforementioned number of elements (including the number of pieces, numerical values, amounts, ranges, and the like).

First Embodiment

FIG. 1 is a diagram illustrating an exemplary configuration of an array-type processor (parallel arithmetic device) 20 according to a first embodiment of the present invention. The array-type processor 20 according to the first embodiment includes a plurality of processor elements that are capable of performing a plurality of arithmetic processes in parallel upon receipt of one operation instruction. Thus, the array-type processor 20 according to the present embodiment permits a dynamic configuration of a circuit (parallel arithmetic processing circuit) for performing arithmetic processes in parallel upon receipt of a smaller number of instructions than in the past. This makes it possible to efficiently use circuit resources. Details are given below.

The array-type processor 20 shown in FIG. 1 is a processor (dynamically reconfigurable processor) in which a circuit suitable for the situation is dynamically configured. The array-type processor 20 includes an interface section 201, a code memory 202, a status management section 203, a matrix circuit section 205, and a data memory section 206. The matrix circuit section 205 is configured so that a plurality of processor elements (PEs) 207 and a plurality of switch elements (SWEs) 208 are disposed in a matrix form. The data memory section 206 includes a plurality of memory units 210. The memory units 210 are disposed, for example, to surround the matrix circuit section 205.

An object code (circuit data) 15 is supplied from the outside to the interface section 201. The code memory 202 includes an information storage medium such as RAM to memorize the object code 15 supplied to the interface section 201.

The object code 15 includes a plurality of contexts (corresponding to a plurality of later-described data paths) and a state transition condition (corresponding to a later-described state transition machine). As each context, operation instructions for the processor elements 207 and for the switch elements 208 are set. As the state transition condition, an operation instruction for the status management section 203, which selects one of the contexts depending on the situation, is set.

The status management section 203 selects one of the contexts in accordance with the status of the state transition machine and outputs a plurality of instruction pointers (IPs) corresponding to the selected context to the processor elements 207.

Figure 2:
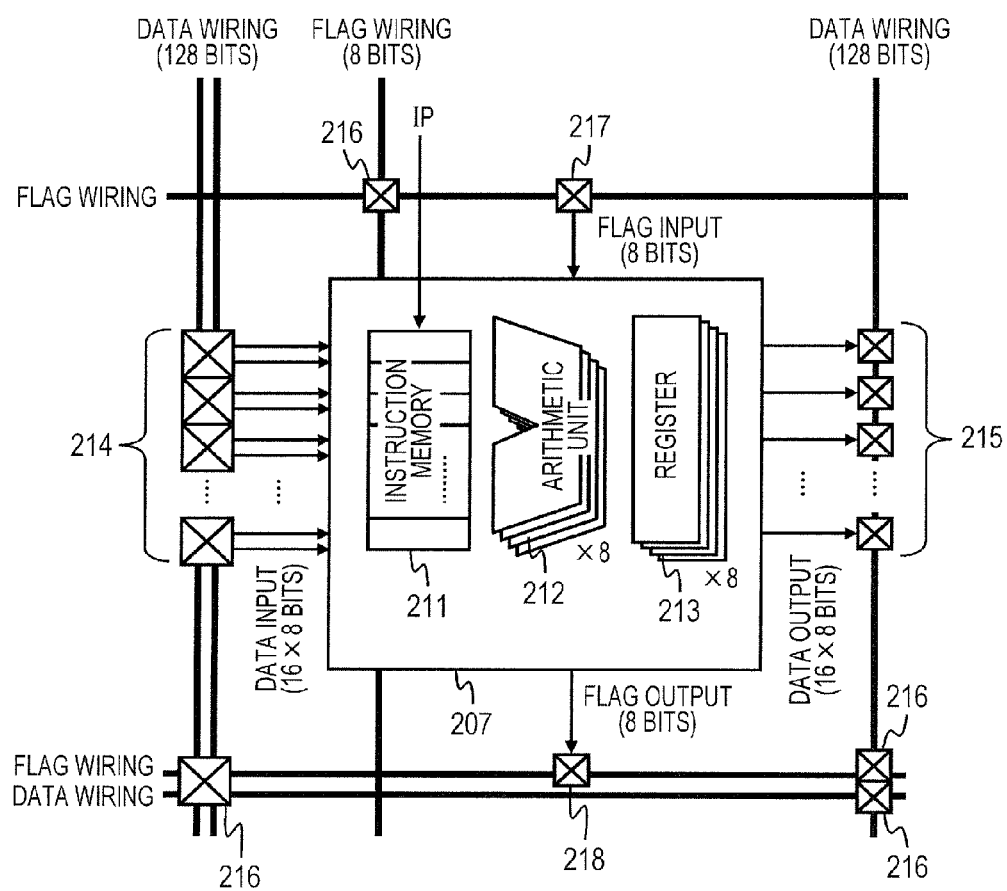
FIG. 2 is a diagram illustrating an exemplary configuration of processor elements and switch elements according to the first embodiment.

FIG. 2 is a diagram illustrating an exemplary configuration of a pair of a processor element 207 and a switch element 208. The processor element 207 includes an instruction memory 211, a plurality of arithmetic units 212, and a plurality of registers 213. The switch element 208 includes wiring coupling switches 214 to 218. Although not shown in the figure, each element in the processor element 207 exchanges data through data wiring and exchanges flags through flag wiring.

The present embodiment will be described on the assumption that the processor element 207 includes eight arithmetic units 212 for performing an arithmetic process on 16-bit data and eight registers 213 for retaining 16-bit data. Accordingly, each data wiring is 128 bits wide (=16 bits wide×8 pieces) and each flag wiring is 8 bits wide (=1 bit wide×8 pieces).

The processor element 207 performs an arithmetic process on data that is supplied from another processor element 207 through data wiring, and outputs a computation result (data) to another processor element 207 through data wiring. Further, a flag is supplied to the processor element 207 from another processor element 207 through flag wiring, and the processor element 207 outputs a flag to another processor element 207 through flag wiring. For example, the processor element 207 determines in accordance with a flag supplied from another processor element 207 whether or not to start an arithmetic process, and outputs a flag corresponding to the result of the arithmetic process to another processor element 207.

The instruction memory 211 stores an operation instruction corresponding to each of the contexts. One of the operation instructions is read out from the instruction memory 211 in accordance with an instruction pointer (IP) from the status management section 203. The processor element 207 and the switch element 208 perform operations in compliance with the operation instruction read out from the instruction memory 211.

Each arithmetic unit 212 performs an arithmetic process on input data in compliance with the operation instruction read out from the instruction memory 211. In this instance, each of the eight arithmetic units 212 performs an arithmetic process in parallel on each of a plurality of sets of input data in compliance with one operation instruction (SIMD instruction) read out from the instruction memory 211.

Each register 213 temporarily stores, for example, the data input into a corresponding arithmetic unit 212, the result of computation performed by the corresponding arithmetic unit 212, and intermediate data derived from the arithmetic process performed by the corresponding arithmetic unit 212. The result of computation performed by each arithmetic unit 212 may be directly output to the outside of a processor unit while bypassing the register 213.

In compliance with an operation instruction read out from the instruction memory 211, the wiring coupling switches 214 to 216 couple a data wiring between the corresponding processor element 207 (a processor element 207 having the instruction memory 211 storing the operation instruction) and another processor element 207 (e.g., a neighboring processor element 207).

In compliance with an operation instruction read out from the instruction memory 211, the wiring coupling switches 216 to 218 couple a flag wiring between the corresponding processor element 207 (a processor element 207 having the instruction memory 211 storing the operation instruction) and another processor element 207 (e.g., a neighboring processor element 207).

The wiring coupling switches 214 to 216 couple wirings in compliance with an operation instruction read out from the instruction memory 211. The wiring coupling switch 216 is disposed at the intersection of a data wiring and a flag wiring.

As described above, each processor element 207 can perform a plurality of arithmetic processes in parallel upon receipt of one operation instruction (SIMD computation). In other words, unlike in the past, the array-type processor 20 according to the present embodiment can perform two or more arithmetic processes in parallel by using one processor element.

As such being the case, the array-type processor 20 according to the present embodiment permits the dynamic configuration of a circuit (parallel arithmetic processing circuit) for performing arithmetic processes in parallel upon receipt of a smaller number of instructions than in the past. This makes it possible to efficiently use circuit resources.

Obviously, each processor element 207 can individually perform an arithmetic process upon receipt of one operation instruction (scalar computation) in the same manner as in the past when one of the arithmetic units 212 is activated.

Processor elements developed in the past can perform only one arithmetic process upon receipt of one operation instruction. In other words, related-art array-type processors can perform a plurality of arithmetic processes in parallel only when they use a plurality of processor elements. Thus, the related-art array-type processors need to dynamically configure a parallel arithmetic processing circuit in response to many operation instructions. Therefore, the related-art array-type processors cannot efficiently use circuit resources.

Second Embodiment

Figure 3:
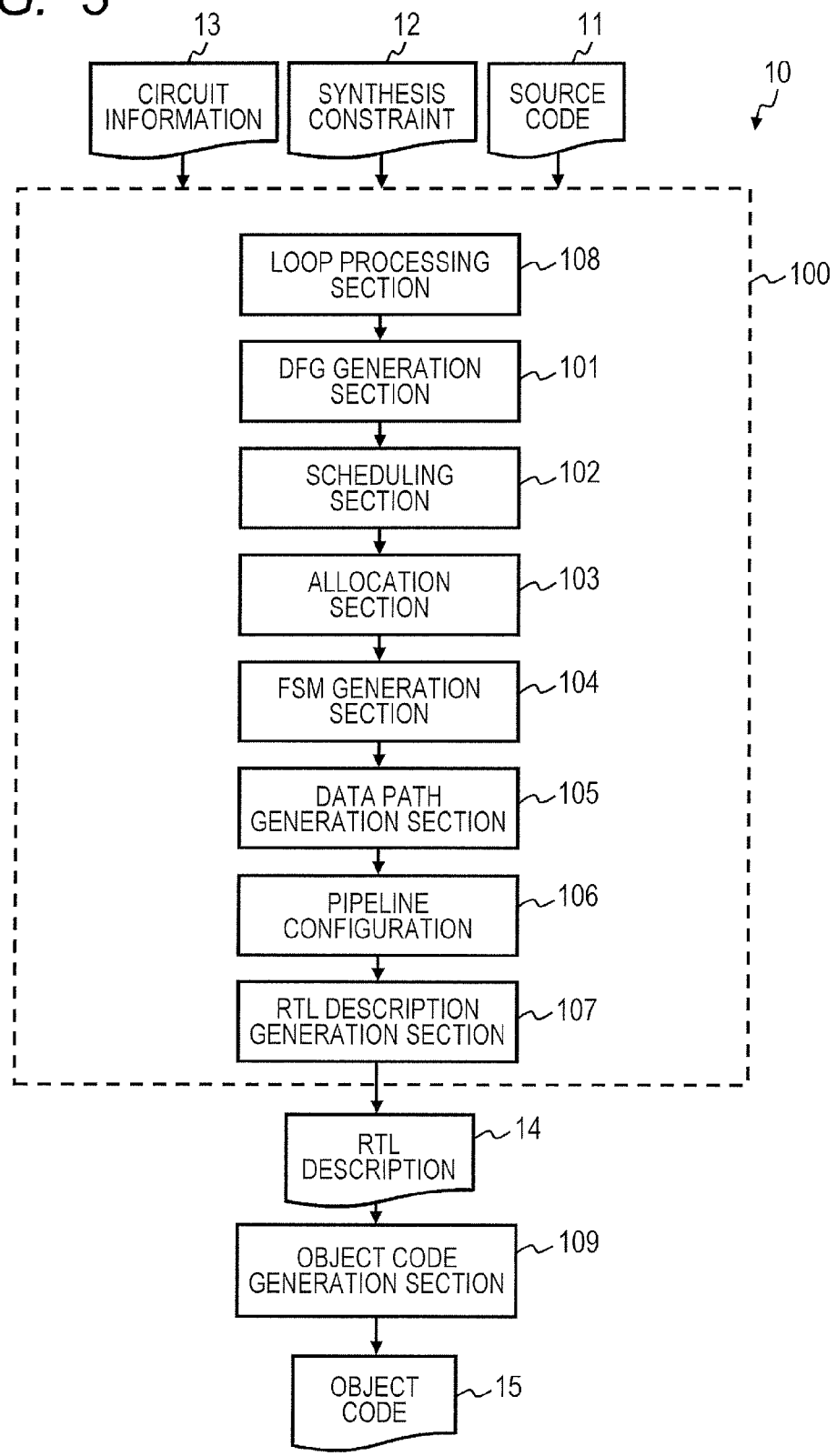
FIG. 3 is a block diagram illustrating an exemplary logical configuration of a data processing device according to a second embodiment of the present invention.

A second embodiment of the present invention will now be described in relation to a data processing device 10 that generates the object code 15 to be supplied to the array-type processor 20. FIG. 3 is a block diagram illustrating an exemplary logical configuration of the data processing device 10 according to the second embodiment.

The data processing device 10 shown in FIG. 3 includes a behavioral synthesis section (behavioral synthesizer) 100 and an object code generation section (layout section) 109. The behavioral synthesis section 100 includes a loop processing section 108, a DFG generation section 101, a scheduling section 102, an allocation section 103, an FSM generation section 104, a data path generation section 105, a pipeline configuration generation section 106, and an RTL description generation section 107.

Figure 4:
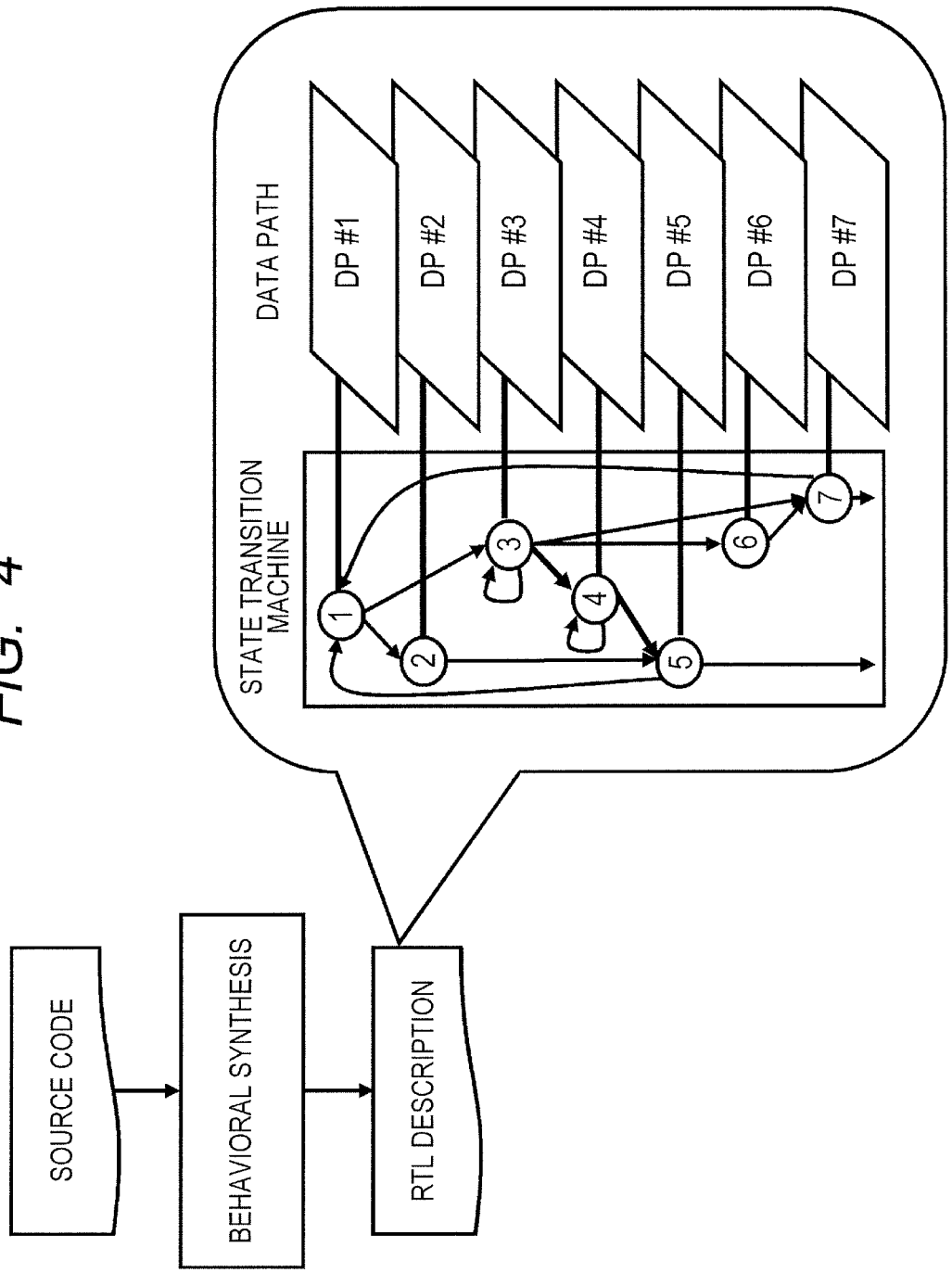
FIG. 4 is a conceptual diagram illustrating a behavioral synthesis section according to the second embodiment.

As shown in a conceptual diagram of FIG. 4, the behavioral synthesis section 100 generates a state transition machine (FSM or finite state machine) and a plurality of data paths corresponding to a plurality of states in the state transition machine from a description in C language or the like of a circuit operation (operation description; hereinafter referred to as the source code) 11, and outputs the generated information as a description of a circuit structure (structural description; hereinafter referred to as the RTL description) 14.

The loop processing section 108 analyzes the syntax of the source code 11 and unrolls a predefined loop description of a plurality of loop descriptions included in the source code 11. In the present embodiment, the loop processing section 108 unrolls a user-specified predefined loop description. The loop processing section 108 may alternatively be configured so that a predefined loop description is automatically selected from the loop descriptions and unrolled.

For example, the loop processing section 108 unrolls a loop description with no data dependency between iterations. In other words, the loop processing section 108 unrolls a loop description with no data dependency between a plurality of loop processes. The unrolled part is synthesized by a behavioral synthesizer as a circuit to be eventually subjected to parallel arithmetic processing (parallel arithmetic processing circuit). This parallel arithmetic processing circuit is dynamically configured by combining one or more switch elements 208 with one or more processor elements 207 that can perform a plurality of arithmetic processes in parallel upon receipt of one operation instruction.

The DFG generation section 101 creates a DFG (data flow graph) in accordance with the result of analysis of the source code 11 and the result of processing by the loop processing section 108. The DFG includes nodes, which represent various processing functions such as a computational function, and branches, which represent the flows of data.

The scheduling section 102 performs scheduling in accordance with a synthesis constraint 12 and circuit information 13 to determine when to execute a plurality of nodes, and outputs the result of scheduling as a CDFG (control data flow graph). The allocation section 103 determines, in accordance with the synthesis constraint 12 and circuit information 13, a register and a memory unit that are to be used to temporarily store data represented by branches in the CDFG. The allocation section 103 also determines which arithmetic unit is to be used to perform computations represented by nodes in the CDFG.

The synthesis constraint 12 includes preselected information such as a circuit scale, a resource amount, a delay constraint (timing constraint; clock frequency), and a pipelining target. The circuit information 13 includes preselected information such as the scale and delay of each of later-described resources (arithmetic unit 212, register 213, memory unit 210, etc.) included in the array-type processor 20.

The scheduling section 102 and the allocation section 103 perform scheduling and allocation, respectively, by giving a dedicated synthesis constraint and circuit information to or performing a forwarding (bypassing) process (described later) on a loop description to be pipelined, which is included in the loop descriptions excluding the loop descriptions to be unrolled. In the present embodiment, the loop description to be pipelined is user-specified. Alternatively, the loop description to be pipelined may be specified automatically by the data processing device 10.

Figure 5A:
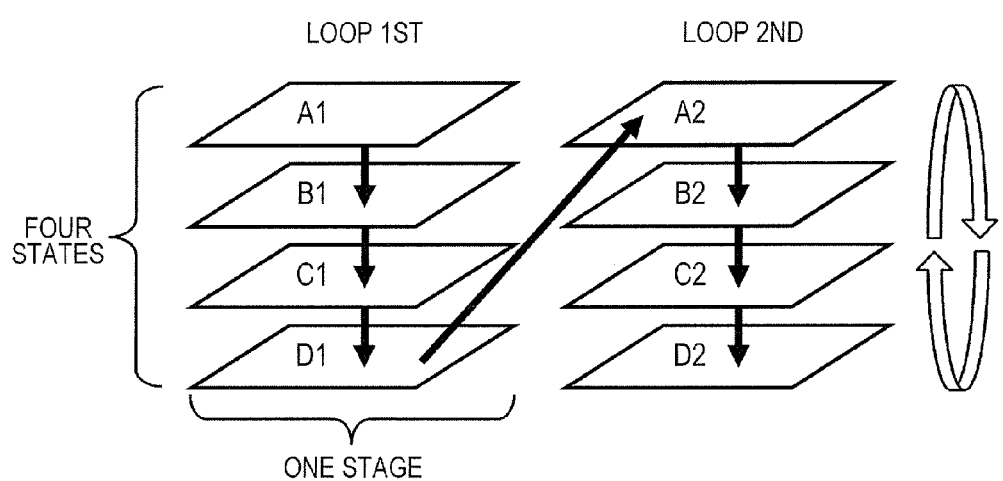
FIG. 5A is a conceptual diagram illustrating a pipelining scheme.

Loop description pipelining will now be briefly described with reference to FIGS. 5A to 5C. FIG. 5A is a conceptual diagram illustrating a process that is performed when a loop description (the number of states=4) is not to be pipelined. FIG. 5B is a conceptual diagram illustrating a process that is performed when four states of a loop description are to be folded into two states for pipelining purposes. FIG. 5C is a conceptual diagram illustrating a process that is performed when four states of a loop description are to be folded into one state for pipelining purposes. In the current example, it is assumed that the number of pipelining stages is four, and that the number of loops (the number of iterations) is ten. In the current example, it is also assumed that one execution cycle (clock cycle) is necessary for executing one stage (a series of processing steps).

When, as shown in FIG. 5A, a loop description (the number of states=4) is not to be pipelined, four stages A1, B1, C1, D1 forming a first loop process are sequentially executed. Next, four stages A2, B2, C2, D2 forming a second loop process are sequentially executed. These processing steps are repeated until a tenth loop process is completed. Consequently, a total of forty execution cycles are required for loop process execution.

When, as shown in FIG. 5B, four states of a loop description are folded into two states for pipelining purposes, four stages A1, B1, C1, D1 forming the first loop process are sequentially executed. Further, four stages A2, B2, C2, D2 forming the second loop process are sequentially executed with a delay of two steps (two execution cycles) from the start of the first loop process. Similarly, the four stages of a third to tenth loop processes are sequentially executed with a delay of two steps (two execution cycles) from the start of the immediately preceding loop process. Hence, for example, the two stages C1, A2 and the two stages D1, B2 are executed in parallel, respectively. Further, for example, the two stages C2, A3 and the two stages D2, B3 are executed in parallel, respectively. As a result, the number of execution cycles required for loop process execution is equal to eighteen execution cycles plus the number of execution cycles required for initialization (epilogue) and post-processing (prologue).

When, as shown in FIG. 5C, four states of a loop description are folded into one state for pipelining purposes, four stages A1, B1, C1, D1 forming the first loop process are sequentially executed. Further, four stages A2, B2, C2, D2 forming the second loop process are sequentially executed with a delay of one step (one execution cycle) from the start of the first loop process. Similarly, the four stages of the third to tenth loop processes are sequentially executed with a delay of one step (one execution cycle) from the start of the immediately preceding loop process. Hence, for example, the four stages D1, C2, B3, A4 and the four stages D2, C3, B4, and A5 are executed in parallel, respectively. As a result, the number of execution cycles required for loop process execution is equal to seven execution cycles plus the number of execution cycles required for initialization (epilogue) and post-processing (prologue). If there is no description other than a loop description when the number of states of the loop description is folded into one state, no state transition machine is generated except during initialization and post-processing.

When a loop description is pipelined as described above, the number of execution cycles is reduced. This provides an increased throughput (processing capacity).

Details of loop description pipelining are also disclosed in "High-level Synthesis Challenges for Mapping a Complete Program on a Dynamically Reconfigurable Processor" (Takao Toi, Noritsugu Nakamura, Yoshinosuke Kato, Toru Awashima, Kazutoshi Wakabayashi, IPSJ Transaction on System LSI Design Methodology, February 2010, vol. 3, pp. 91-104), published by the inventors of the present invention.

Figure 6:
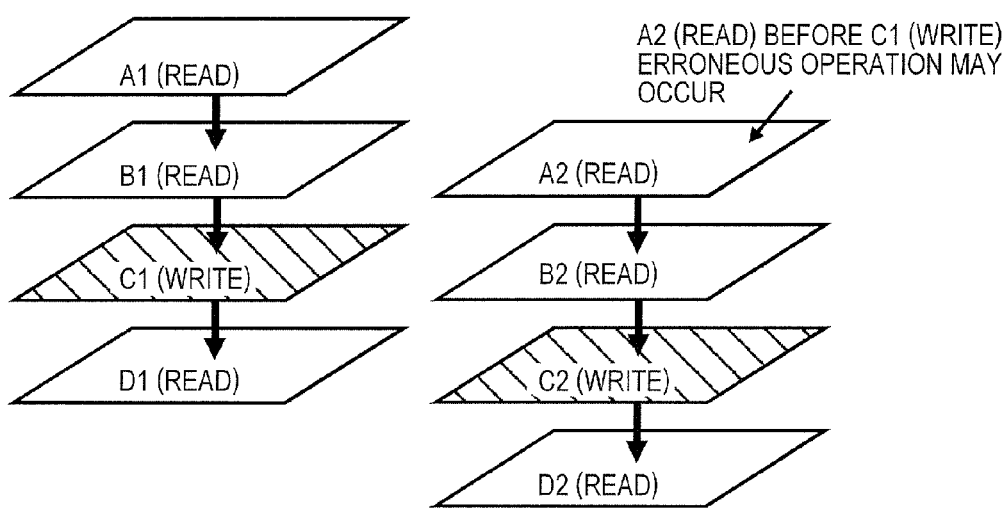
FIG. 6 is a conceptual diagram illustrating a data hazard.

However, when a loop description is pipelined, a data hazard may occur. Therefore, it is necessary to avoid such a data hazard. The data hazard will now be described briefly with reference to FIG. 6. In the example used for the description of the data hazard, it is assumed that the prevailing conditions are the same as those indicated in FIG. 5C.

At first, the four stages A1 (read), B1 (read), C1 (write), D1 (read) of the first loop process are sequentially executed. Further, the four stages A2 (read), B2 (read), C2 (write), D2 (read) of the second loop process are sequentially executed with a delay of one step from the start of the first loop process. In this instance, a data read process at the stage A2 is performed earlier than a data write process at the stage C1. Therefore, it is probable that irrelevant data may be read out. This type of problem is referred to as a data hazard.

Such a data hazard can be avoided, for example, by performing a forwarding (bypassing) process during scheduling for behavioral synthesis. This ensures that the data read process at the stage A2 is not executed earlier than the data write process at the stage C1.

Returning to FIG. 3, the FSM generation section 104 generates a state transition machine in accordance with the results produced by the scheduling section 102 and the allocation section 103. Further, the data path generation section 105 generates a plurality of data paths corresponding respectively to a plurality of states included in the state transition machine in accordance with the results produced by the scheduling section 102 and the allocation section 103. Furthermore, the pipeline configuration generation section 106 achieves pipelining by collapsing a plurality of states included in the loop description to be pipelined.

The RTL description generation section 107 outputs the above-mentioned state transition machine and the data paths corresponding respectively to the states included in the state transition machine as the RTL description 14.

Subsequently, the object code generation section 109 reads the RTL description 14, generates a net list by performing, for example, technology mapping and a place and route, subjects the net list to binary conversion, and outputs the result of binary conversion as the object code 15.

As described above, the behavioral synthesis section 100 unrolls a loop description with no data dependency between iterations and performs behavioral synthesis to generate a parallel arithmetic processing circuit. The array-type processor 20 then dynamically configures the parallel arithmetic processing circuit by combining one or more switch elements 208 with one or more processor elements 207 that can perform a plurality of arithmetic processes in parallel upon receipt of one operation instruction. Therefore, the array-type processor 20 can dynamically configure the parallel arithmetic processing circuit upon receipt of a smaller number of operation instructions than in the past. This makes it possible to efficiently use circuit resources.

Figure 7:
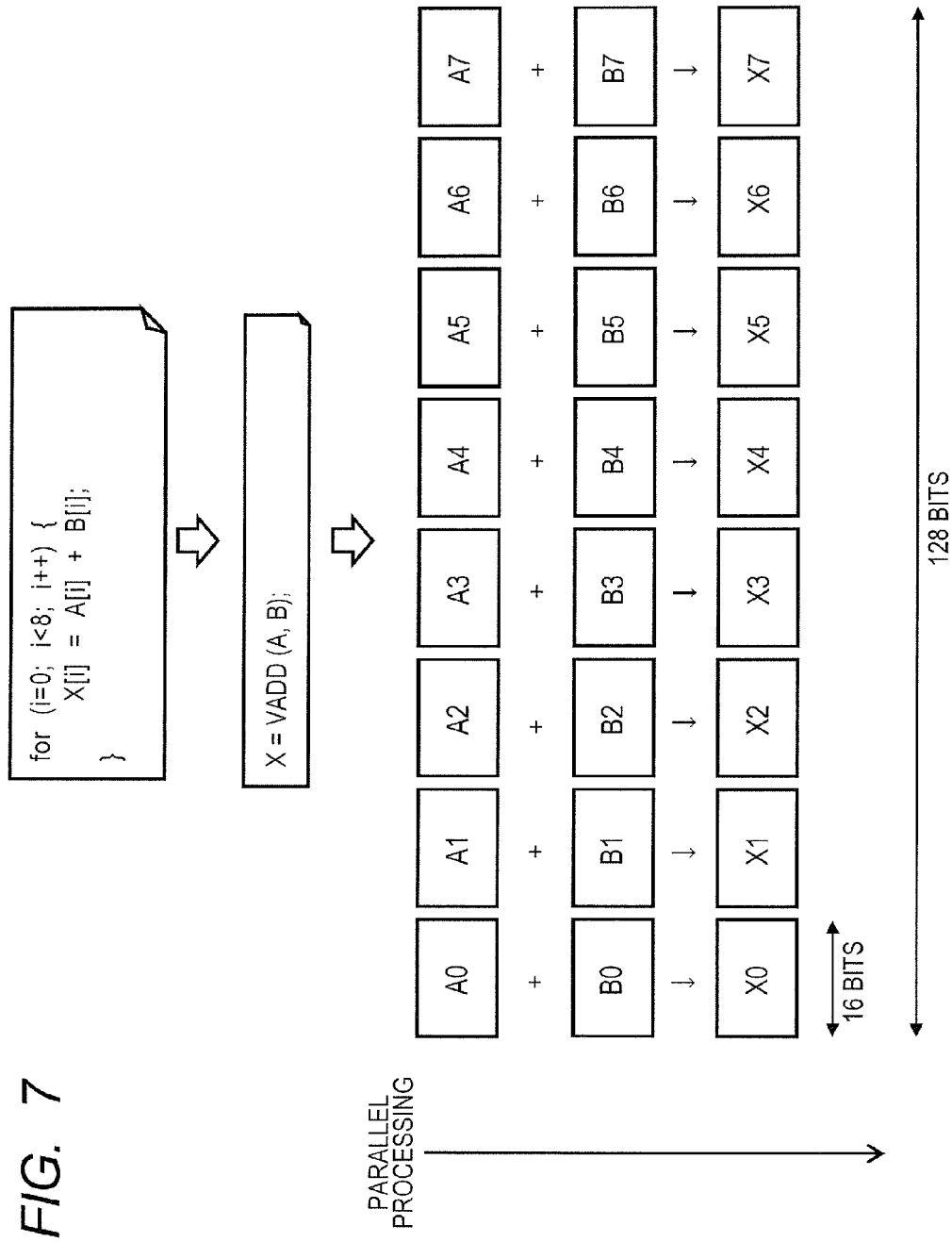
FIG. 7 is a diagram illustrating a SIMD computation process that is performed by a processor element according to the second embodiment.

FIG. 7 is a diagram illustrating a SIMD computation process that is performed by the processor element 207. As shown in FIG. 7, the eight arithmetic units 212 in the processor element 207 add 16-bit data A0 to A7 to 16-bit data B0 to B7 and output data X0 to X7 as the results of additions in compliance with one operation instruction (SIMD instruction).

Figure 8:
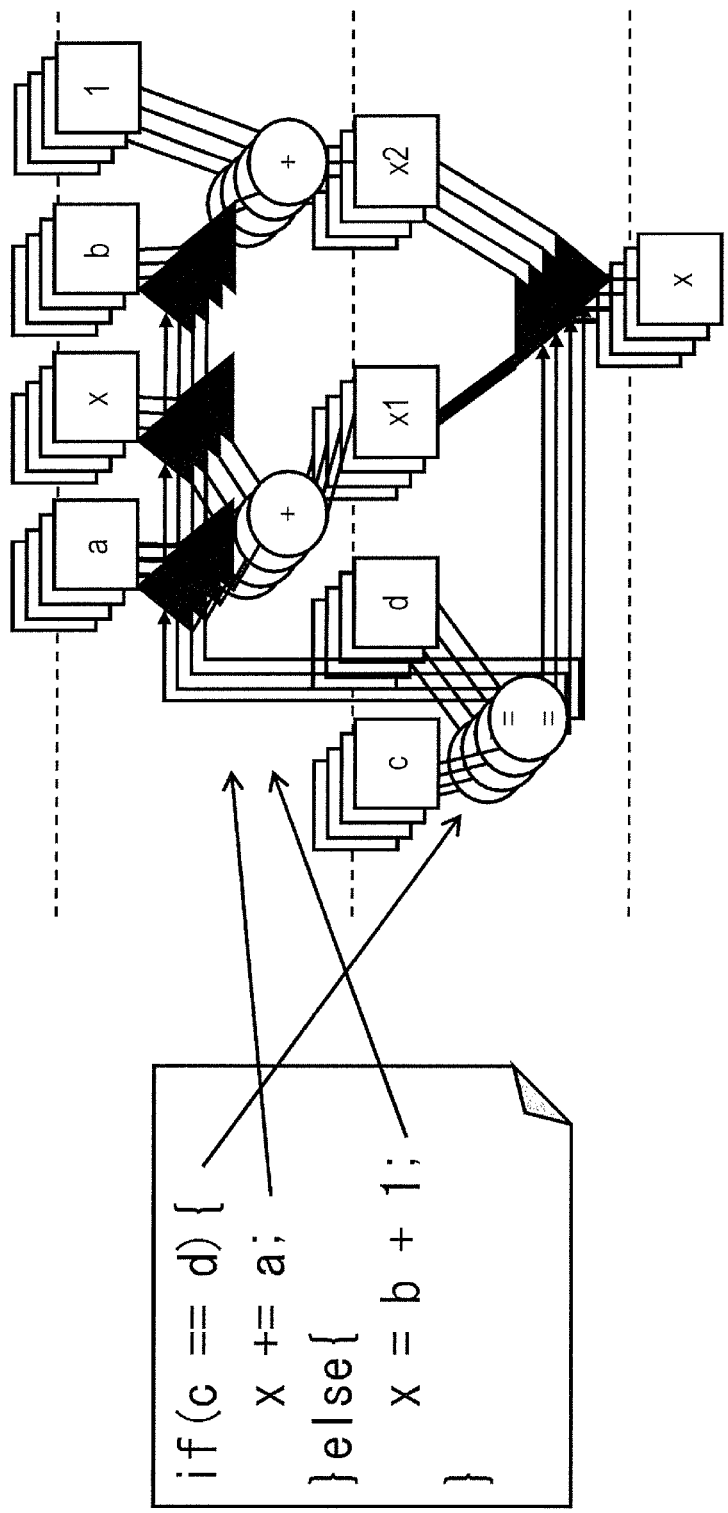
FIG. 8 is a diagram illustrating how a conditional branch is executed by the array-type processor according to the second embodiment.

FIG. 8 is a diagram illustrating how a conditional branch is executed by the array-type processor 20. As shown in FIG. 8, a conditional branch is synthesized as a data path containing a multiplexer (marked ▲ or ▼ in the figure) during later-described behavioral synthesis. This ensures that even if there are two or more conditional branches for a certain set of data, the multiplexer selects one of the conditional branches after the conditional branches are executed in parallel. Hence, an increase in the number of execution cycles is suppressed. When a loop description containing a conditional branch is unrolled, the above operation is performed in parallel for unrolled data sets in parallel. The selection to be made by the multiplexer is controlled by a flag or the like.

(Flowchart)

Figure 9:
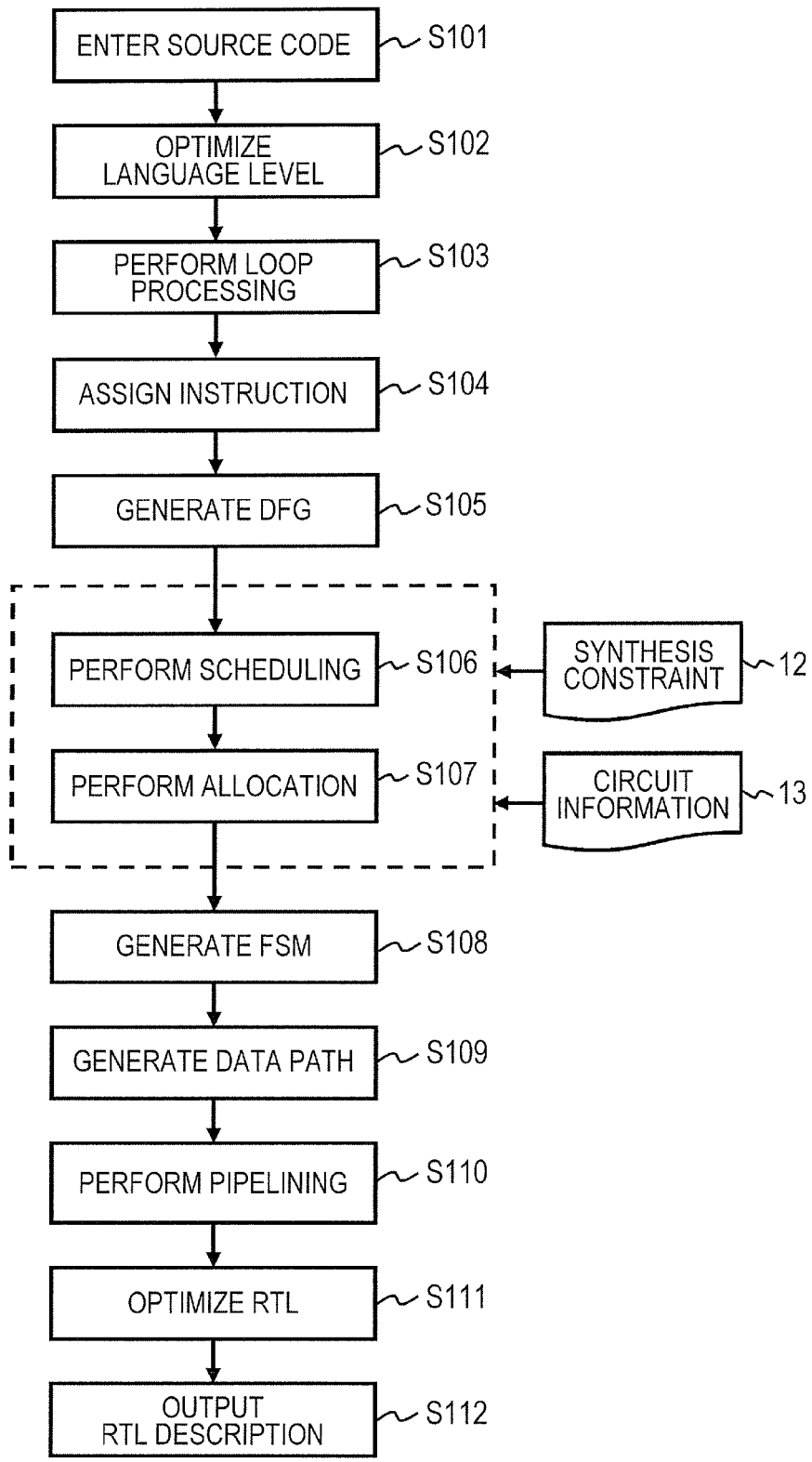
FIG. 9 is a flowchart illustrating an operation of the behavioral synthesis section according to the second embodiment.

An operation of the behavioral synthesis section 100 in the data processing device 10 will now be described with reference to FIG. 9. FIG. 9 is a flowchart illustrating an operation of the behavioral synthesis section 100.

First of all, the behavioral synthesis section 100 performs syntax analysis (step S101) upon receipt of the source code 11, and then optimizes an operation description language level (step S102).

In this instance, the behavioral synthesis section 100 selects a predefined loop description from a plurality of loop descriptions included in the source code 11 and unrolls the selected loop description (step S103).

For example, the behavioral synthesis section 100 unrolls a loop description with no data dependency between iterations. In other words, the behavioral synthesis section 100 unrolls a loop description with no data dependency between a plurality of loop processes. The unrolled part is synthesized by a behavioral synthesizer as a circuit to be eventually subjected to parallel arithmetic processing (parallel arithmetic processing circuit). This parallel arithmetic processing circuit is dynamically configured by combining one or more switch elements 208 with one or more processor elements 207 that can perform a plurality of arithmetic processes in parallel upon receipt of one operation instruction.

Subsequently, the behavioral synthesis section 100 assigns nodes, which represent various processing functions, and branches, which represent the flows of data (step S104), and prepares a DFG (step S105).

Next, the behavioral synthesis section 100 performs scheduling (step S106) and allocation (step S107) in accordance with the synthesis constraint 12 and with the circuit information 13.

Next, in accordance with the results of scheduling and allocation, the behavioral synthesis section 100 generates a state transition machine and a plurality of data paths corresponding respectively to the states included in the state transition machine (steps S108 and S109). Further, the behavioral synthesis section 100 achieves pipelining by collapsing a plurality of states included in the loop description to be pipelined (step S110). Subsequently, the behavioral synthesis section 100 optimizes an RT level and logic level with respect to the state transition machines and data paths (step S111), and outputs the result of optimization as the RTL description 14 (step S112).

As described above, the behavioral synthesis section 100 unrolls a loop description with no data dependency between iterations and performs behavioral synthesis to generate a parallel arithmetic processing circuit. Subsequently, the array-type processor 20 dynamically configures the parallel arithmetic processing circuit by combining one or more switch elements 208 with one or more processor elements 207 that can perform a plurality of arithmetic processes in parallel upon receipt of one operation instruction. Therefore, the array-type processor 20 can dynamically configure the parallel arithmetic processing circuit upon receipt of a smaller number of operation instructions than in the past. This makes it possible to efficiently use circuit resources.

(Exemplary Hardware Configuration of Data Processing Device 10)

The behavioral synthesis section 100 according to the present embodiment and the data processing device 10 having the behavioral synthesis section 100 can be implemented, for instance, with a general-purpose computer system. A brief description is given below with reference to FIG. 10.

Figure 10:
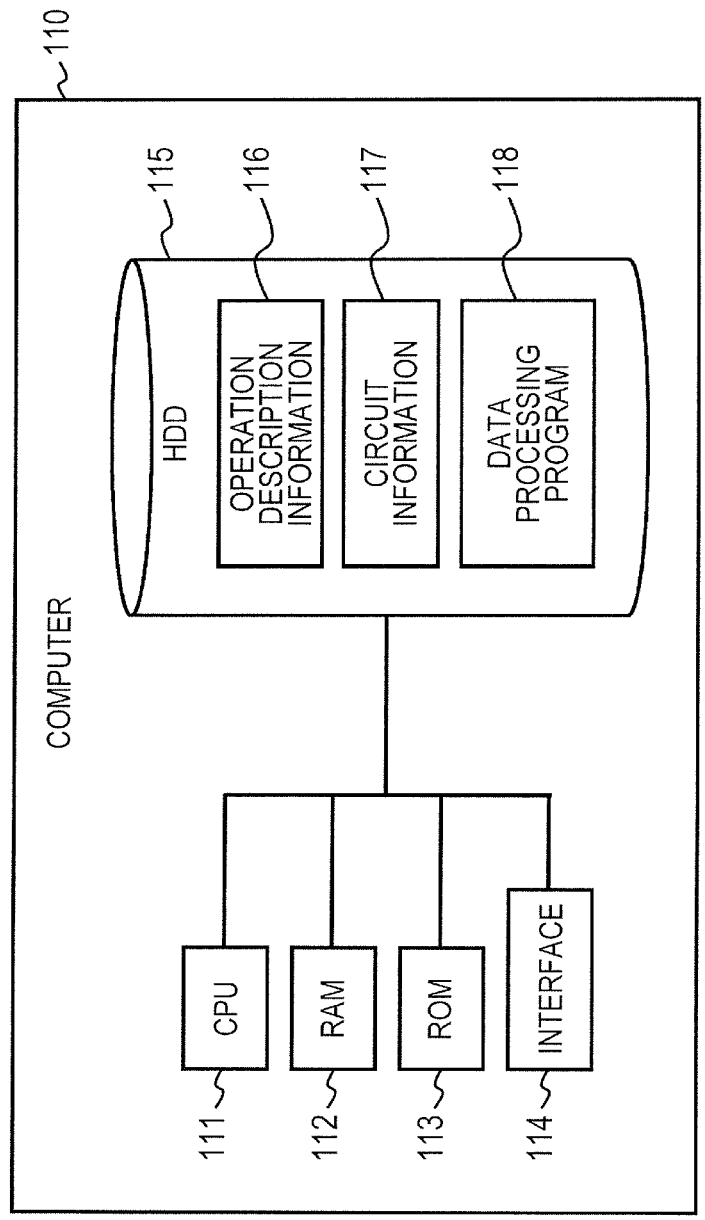
FIG. 10 is a block diagram illustrating an exemplary hardware configuration of the data processing device according to the second embodiment.

FIG. 10 is a block diagram illustrating an exemplary hardware configuration of the data processing device 10 according to the present embodiment. A computer 110 includes, for example, a CPU (central processing unit) 111, a RAM (random-access memory) 112, a ROM (read-only memory) 113, an interface 114, and a HDD (hard disk drive) 115. The CPU 111 acts as a control device. The interface 114 acts as an interface with the outside world. The HDD 115 is an example of a nonvolatile storage device. The computer 110 may also include devices not shown including an input device such as a keyboard or a mouse and a display device such as a display.

The HDD 115 stores an OS (operating system) (not shown), operation description information 116, circuit information 117, and a data processing program 118. The operation description information 116 relates to a circuit operation and corresponds, for instance, to the source code (operation description) 11 shown in FIG. 3. The circuit information 117 relates to a circuit structure and corresponds to the object code 15 shown in FIG. 3. The data processing program 118 is a computer program in which a behavioral synthesis process according to the present embodiment is implemented.

The CPU 111 controls, for example, various processes performed in the computer 110 and access to the RAM 112, ROM 113, interface 114, and HDD 115. The computer 110 is configured so that the CPU 111 reads and executes the OS and the data processing program 118, which are stored on the HDD 115. This enables the computer 110 to implement the behavioral synthesis section 100 according to the present embodiment and the data processing device 10 having the behavioral synthesis section 100.

(Data Processing System 1)

Figure 11:
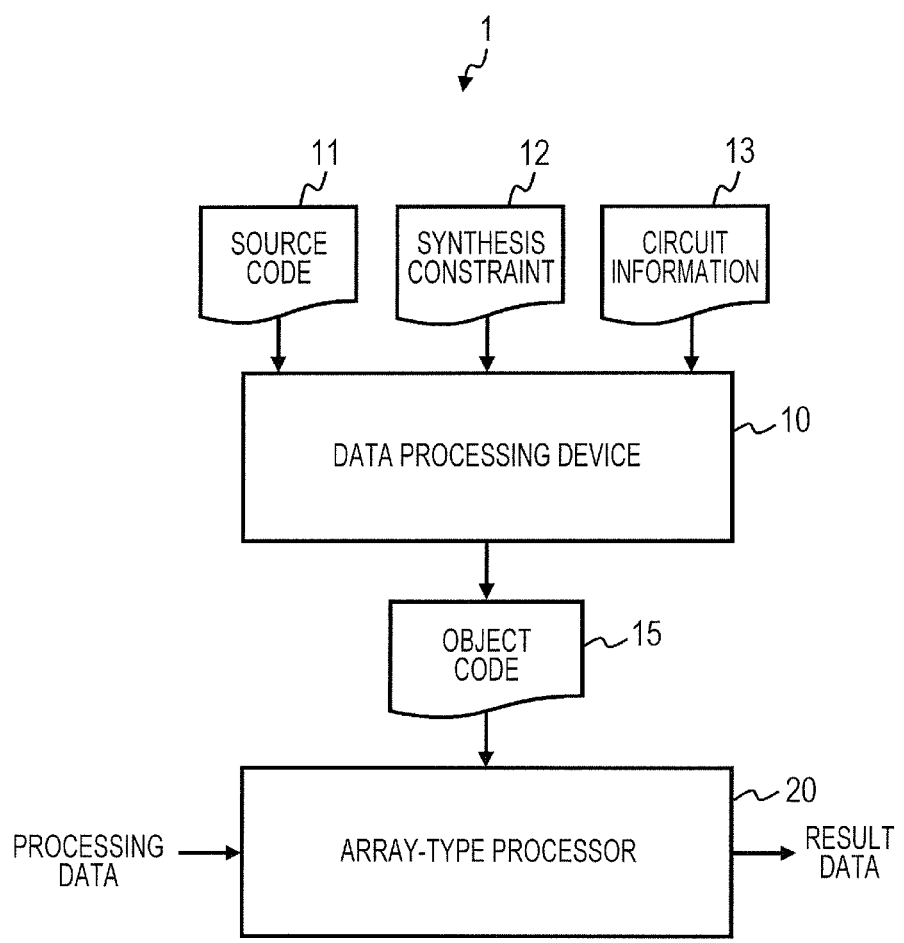
FIG. 11 is a block diagram illustrating an exemplary configuration of a data processing system according to the second embodiment.

FIG. 11 is a block diagram illustrating an exemplary configuration of a data processing system 1 having the data processing device 10 and the array-type processor 20.

In the data processing system 1 shown in FIG. 11, the data processing device 10 reads the source code 11, the synthesis constraint 12, and the circuit information 13 to generate the object code 15. The array-type processor 20 performs an arithmetic process on processing data supplied from the outside and outputs the result of processing as result data while dynamically changing a circuit configuration for each state in accordance with the object code 15 output from the data processing device 10.

Third Embodiment

A third embodiment of the present invention will now be described in relation to a concrete example of a loop description that is to be unrolled. FIG. 12 is a diagram illustrating an example of a loop description included in the source code 11. In FIG. 12, a multiple loop is depicted as an example of a loop description. In the following description, an inner loop description is referred to as the inner loop, whereas an outer loop description is referred to as the outer loop.

The behavioral synthesis section 100 not only pipelines the whole or part of a loop description with data dependency between iterations and performs behavioral synthesis, but also unrolls the whole or part of a loop description with no data dependency between iterations and performs behavioral synthesis.

In the example shown in FIG. 12, the inner loop has data dependency between iterations and is therefore suitable for being pipelined. On the other hand, the outer loop has no data dependency between iterations and is suitable for being unrolled and processed independently. In the example shown in FIG. 12, therefore, the behavioral synthesis section 100 not only pipelines the inner loop and performs behavioral synthesis, but also unrolls the outer loop and performs behavioral synthesis.

As a result, the array-type processor 20 can not only perform SIMD computations on a circuit corresponding to the outer loop for parallel processing purposes, but also pipeline a circuit corresponding to the inner loop for parallel processing purposes. Consequently, the array-type processor 20 can perform a wider range of parallel processing than a related-art SIMD processor.

As regards a multiple loop, the inner loop is suitable for being pipelined because it has data dependency between iterations, whereas the outer loop is suitable for being unrolled and processed independently because it has no data dependency between iterations. Concrete examples are given below.

First Concrete Example

As for JPEG and MPEG, the loop processes for the outer and inner loops are, for example, as indicated below. Outer loop: The loop process is performed on each macro-block of 8-row×8-column pixels or 16-row×16-column pixels.
Inner loop: The loop process is a DCT conversion process that is performed on each macro-block of a plurality of pixels.

Second Concrete Example

As for voice signal FFT conversion, the loop processes for the outer and inner loops are, for example, as indicated below.
Outer loop: The loop process is performed on each block of 1024 point signals.
Inner loop: The loop process is an FFT process that is performed on each block of 1024 point signals.

Third Concrete Example

As for an FIR image filter, the loop processes for the outer and inner loops are, for example, as indicated below.
Outer loop: The loop process is performed on each block that is obtained when an image frame or an image is divided into regions.
Inner loop: The loop process is a filter process that is performed on each block of pixels.

Fourth Concrete Example

When the moving average of a plurality of stock prices is to be calculated, the loop processes for the outer and inner loops are, for example, as indicated below.

Outer loop: Stock name.
Inner loop: The loop process is a process of calculating the moving average of each stock.

Fourth Embodiment

A fourth embodiment of the present invention will now be described in relation to a detailed method that the behavioral synthesis section 100 uses to automatically assign a SIMD instruction to an unrolled part of a loop described with a scalar variable (a detailed method of automatically rewriting the unrolled part with a vector variable). The fourth embodiment will be described on the assumption that the behavioral synthesis section 100 unrolls a part of the outer loop of a multiple loop shown in FIG. 12 and pipelines the remaining loop description.

For example, the behavioral synthesis section 100 divides the outer loop having four hundred iterations into a loop description (first loop description) A having eight iterations and a loop description (second loop description) B having fifty iterations in accordance with the number of arithmetic units (eight units) in each processor element 207.

Next, the behavioral synthesis section 100 unrolls the loop description A having eight loop descriptions as shown in FIG. 14. More specifically, as shown in FIG. 14, the behavioral synthesis section 100 unrolls the process in the inner loop into eight sections in parallel in accordance with the number of iterations of the loop description A.

Next, as shown in FIG. 15, the behavioral synthesis section 100 consolidates eight scalar data of an unrolled process in parallel in the inner loop into one vector data and substitutes one vector addition instruction VADD for eight scalar addition instructions (i.e., assigns one SIMD addition instruction VADD to eight scalar addition instructions).

As described above, the behavioral synthesis section 100 unrolls a loop described with a scalar variable and then assigns a SIMD instruction to the unrolled part.

Figure 16:
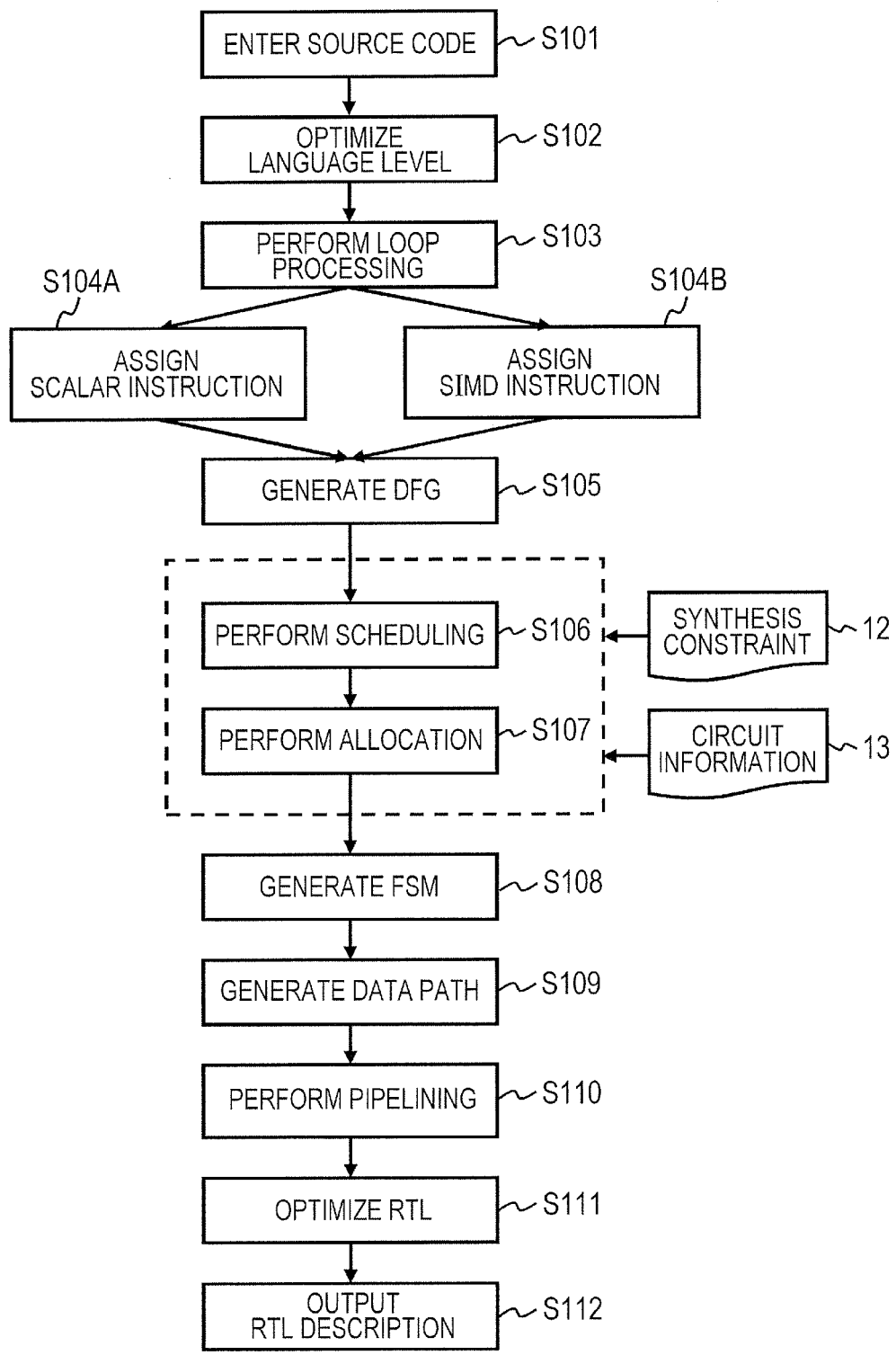
FIG. 16 is a flowchart illustrating an operation of the behavioral synthesis section according to the fourth embodiment.
Figure 17:
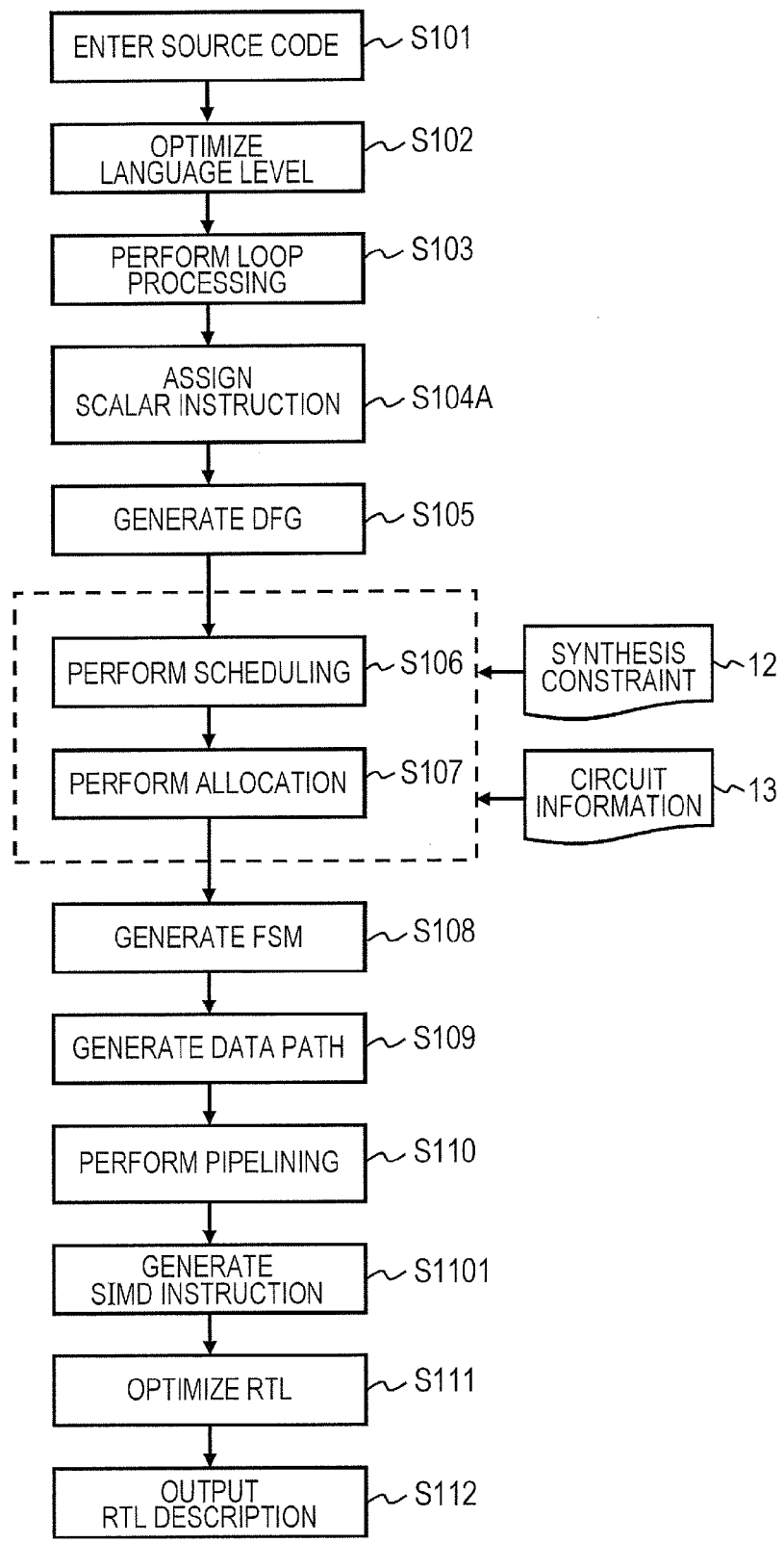
FIG. 17 is a flowchart illustrating an operation of the behavioral synthesis section according to the fourth embodiment.

Exemplary methods that the behavioral synthesis section 100 uses to assign the SIMD instruction will now be described with reference to FIGS. 16 and 17. FIG. 16 is a flowchart illustrating an operation that is performed by the behavioral synthesis section 100 when a first SIMD instruction assignment method is used. FIG. 17 is a flowchart illustrating an operation that is performed by the behavioral synthesis section 100 when a second SIMD instruction assignment method is used.

(First SIMD Instruction Assignment Method)

Referring to the example shown in FIG. 16, the behavioral synthesis section 100 selects a predefined loop description from a plurality of loop descriptions included in the source code 11 to unroll the selected loop description (step S103), assigns the above-mentioned SIMD instruction to the unrolled part (step S104B), and assigns a related-art scalar instruction to other loop descriptions (step S104A).

The other operations of the behavioral synthesis section 100 shown in FIG. 16 are the same as those indicated in FIG. 9 and will not be redundantly described.

The first SIMD instruction assignment method inhibits a scheduling process from becoming complicated and is therefore advantageous in that the total processing time for behavioral synthesis is reduced.

(Second SIMD Instruction Assignment Method)

Referring to the example shown in FIG. 17, the behavioral synthesis section 100 selects a predefined loop description from the loop descriptions included in the source code 11 to unroll the selected loop description (step S103), and assigns the related-art scalar instruction to both the rolled part and the other loop descriptions (step S104A).

In the subsequent processes ranging from DFG generation (step S105) to pipelining (step S110), data is entirely processed as a scalar amount.

Subsequently, the behavioral synthesis section 100 assigns the above-mentioned SIMD instruction to the unrolled part of the loop description (step S1101), optimizes the RTL (step S111), and outputs the RTL description (step S112).

The second SIMD instruction assignment method is advantageous in that it is practically unnecessary to change an existing behavioral synthesis flow.

As described above, the behavioral synthesis section 100 according to the present embodiment unrolls a predefined loop description included in an operation description and automatically assigns a SIMD instruction for the array-type processor 20 to the unrolled part. This eliminates the necessity of learning a dedicated language including, for example, the SIMD instruction. Consequently, the length of design time can be reduced.

As described above, the array-type processor (parallel arithmetic device) 20 according to the foregoing embodiments includes a plurality of processor elements 207 that are capable of performing a plurality of arithmetic processes in parallel upon receipt of one operation instruction. Therefore, the array-type processor 20 according to the foregoing embodiments can dynamically configure a parallel arithmetic processing circuit that performs arithmetic processes in parallel upon receipt of a smaller number of operation instructions than in the past. This makes it possible to efficiently use circuit resources.

Further, the behavioral synthesis section (behavioral synthesizer) 100 according to the foregoing embodiments unrolls a loop description with no data dependency between iterations and performs behavioral synthesis to generate a parallel arithmetic processing circuit. The array-type processor 20 then dynamically configures the parallel arithmetic processing circuit by combining one or more switch elements 208 with one or more processor elements 207 that can perform a plurality of arithmetic processes in parallel upon receipt of one operation instruction. Consequently, the array-type processor 20 according to the foregoing embodiments can dynamically configure the parallel arithmetic processing circuit upon receipt of a smaller number of operation instructions than in the past. This makes it possible to efficiently use circuit resources.

Furthermore, the behavioral synthesis section (behavioral synthesizer) 100 according to the foregoing embodiments unrolls a loop description included in an operation description and automatically assigns a SIMD instruction to the unrolled part. This eliminates the necessity of learning a dedicated language including, for example, the SIMD instruction. Consequently, the length of design time can be reduced.

Moreover, the array-type processor 20 according to the foregoing embodiments can not only perform SIMD computations for parallel processing purposes, but also perform pipelining for parallel processing purposes. Consequently, the array-type processor 20 can perform a wider range of parallel processing than a related-art SIMD processor. As the amount of computation processible by a single operation instruction increases with an increase in the degree of parallelism, the performance per unit area increases. Further, as the same amount of computation can be provided at a lower frequency, the power consumption per unit performance is suppressed.

The foregoing embodiments have been described on the assumption that each processor element 207 includes eight arithmetic units capable of performing an arithmetic process on 16-bit data. However, the present invention is not limited to such a configuration. The employed configuration can be changed as needed so that each processor element 207 includes two or more arithmetic units. Further, the employed configuration can also be changed as needed so that each processor element 207 includes arithmetic units capable of performing an arithmetic process on data with a bit width other than 16 bits. In this instance, however, the bit widths of data wiring, flag wiring, and the like need to be changed as well.

The foregoing embodiments have been described on the assumption that the behavioral synthesis section 100 unrolls an outer loop of a multiple loop having an inner loop as well as the outer loop. However, the present invention is not limited to the use of such an unrolling scheme. The employed configuration can be changed as needed so that the behavioral synthesis section 100 unrolls a loop description with no data dependency between iterations.

It is useful in terms of functional safety to provide each processor element 207 with two or any more number of arithmetic units. In this case, the behavioral synthesis section 100 assigns identical copied scalar instructions to multiple arithmetic units in the respective processor elements 207 by copying scalar instructions during assignment of a SIMD instruction. Detecting whether the results of operations are matched between the multiple arithmetic units with the identical instructions allocated or providing an additional circuit for correction make it possible to handle the case of failure in part of the arithmetic units in the processor element. For the use together with the foregoing embodiments, for instance, copied scalar instructions are assigned to two arithmetic units in the above-described processor element provided with eight arithmetic units, and then the processor element can be used as SIMD computation enabling parallel execution of four instructions. For correction, three or more arithmetic units are made to execute identical instructions to enable majority calculation of correct values. Besides, the behavioral synthesis section 100 according to the foregoing embodiments and the data processing device having the behavioral synthesis section 100 can implement an arbitrary process by having the CPU (central processing unit) execute a computer program.

In the above example, the program can be stored on various types of non-transitory computer-readable media and supplied to the computer. The non-transitory computer-readable media include various types of tangible storage media. More specifically, the non-transitory computer-readable media include a magnetic recording medium (e.g., flexible disk, magnetic tape, or hard disk drive), a magneto-optical recording medium (e.g., magneto-optical disk), a CD-ROM (read-only memory), a CD-R, a CD-R/W, a DVD (digital versatile disc), a BD (Blu-ray (registered trademark) disc), a semiconductor memory (e.g., mask ROM, PROM (programmable ROM), EPROM (erasable PROM), flash ROM, or RAM (random-access memory)). The program may be supplied to the computer by using various types of transitory computer-readable media. The transitory computer-readable media include an electrical signal, an optical signal, and an electromagnetic wave. The transitory computer-readable media can supply the program to the computer through an electric wire, optical fiber, or other wired communication path or a wireless communication path.

(Differences from Related-Art Technologies)

The SIMD processor disclosed in Japanese Patents Nos. 4292197 and 4699002 and in Japanese Unexamined Patent Application Publication (Translation of PCT Application) No. 2010-539582 successively interprets operation instructions in the same manner as a CPU and the like and performs a plurality of arithmetic processes in parallel. In the SIMD processor, a conditional branch is implemented as a jump instruction.

Consequently, even when, for instance, a conditional branch dependent only on one of a plurality of sets of data to be processed in parallel occurs, the SIMD processor cannot execute the conditional branch with respect to only the one set of data. In other words, even when, for instance, a conditional branch dependent only on one of a plurality of sets of data to be processed in parallel occurs, the SIMD processor needs to execute the conditional branch with respect to all the sets of data. It means that the SIMD processor has to entirely execute the conditional branch with respect to all the sets of data to be processed in parallel. This results in an increase in the number of execution cycles.

FIG. 18 is a diagram illustrating how a conditional branch is executed by the SIMD processor. In the example shown in FIG. 18, the numerals 0 to 7 represent a plurality of sets of data to be processed in parallel, "EXECUTION" represents the execution of an arithmetic process, "TRUE" indicates that the conditional branch is true, and "FALSE" indicates that the conditional branch is false. As is obvious from FIG. 18, "if" and "else" conditional branches are both executed with respect to the sets of data 0 to 7 to be processed in parallel. That is why the number of execution cycles is increased.

Meanwhile, the array-type processor according to the foregoing embodiments includes a plurality of processor elements that can perform a plurality of arithmetic processes in parallel upon receipt of one operation instruction (SIMD computations). Therefore, the array-type processor according to the foregoing embodiments can dynamically configure a circuit for performing arithmetic processes in parallel upon receipt of a small number of operation instructions. In other words, the array-type processor according to the foregoing embodiments can perform SIMD computations as is the case with the SIMD processor.

Here, the conditional branch is not implemented as a jump instruction, but is synthesized as a data path containing a multiplexer during behavioral synthesis. Therefore, unlike the SIMD processor, the array-type processor according to the foregoing embodiments suppresses an increase in the number of execution cycles even when a plurality of conditional branches exist. In other words, the degradation in computational performance is suppressed.

Further, the related-art SIMD processor is often designed by using an operation description given in a dedicated language extended to handle a vector as a variable instead of using an operation description given, for instance, in C language.

Meanwhile, the behavioral synthesis section (behavioral synthesizer) according to the foregoing embodiments unrolls a predefined loop description included in an operation description given in C language or the like and automatically assigns a SIMD instruction to the unrolled part. This eliminates the necessity of learning a dedicated language, thereby making it possible to reduce the length of design time.

Figure 19:
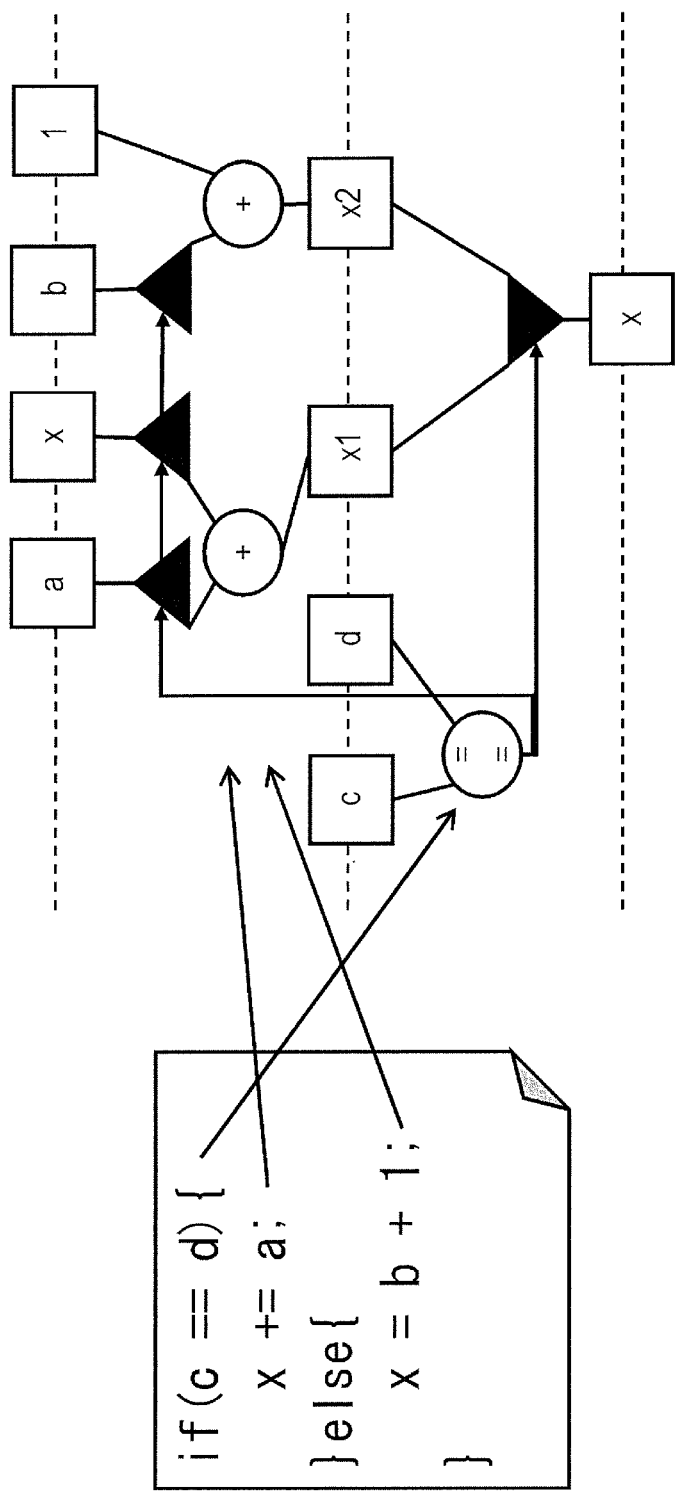
FIG. 19 is a diagram illustrating how a conditional branch is executed by a related-art dynamically reconfigurable processor.

The dynamically reconfigurable processor disclosed in Japanese Patents Nos. 3921367 and 3861898 forms a circuit by dynamically changing the processing of each of a plurality of processor elements and the relation of coupling therebetween as described earlier. Hence, the dynamically reconfigurable processor can reuse circuit resources to perform a complicated arithmetic process with a small-scale circuit. Here, as shown in FIG. 19, a conditional branch is synthesized as a data path containing a multiplexer (marked ▲ or ▼ in the figure) during behavioral synthesis. Therefore, even when a plurality of conditional branches exist, the related-art dynamically reconfigurable processor suppresses an increase in the number of execution cycles.

However, as mentioned earlier, the related-art dynamically reconfigurable processor has to store in memory an extremely large number of instructions about the processing of each of a plurality of processor elements and the relation of coupling therebetween. Hence, the related-art dynamically reconfigurable processor cannot efficiently use circuit resources.

Meanwhile, the array-type processor according to the foregoing embodiments includes a plurality of processor elements that are capable of performing a plurality of arithmetic processes in parallel (SIMD computations) upon receipt of one operation instruction. Hence, the array-type processor according to the foregoing embodiments can dynamically configure a circuit for performing arithmetic processes in parallel upon receipt of a small number of instructions. Consequently, circuit resources can be efficiently used.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

What is claimed is:

1. A parallel arithmetic device comprising:
a status management section that selects one of a plurality of contexts depending on the situation;
a plurality of processor elements that determine, in accordance with the context selected by the status management section, arithmetic processing to be performed; and
a plurality of switch elements that determine the relation of coupling of each of the processor elements in accordance with the context selected by the status management section;
wherein each of the processor elements includes:
an instruction memory that memorizes a plurality of operation instructions corresponding respectively to the contexts so that an operation instruction corresponding to the context selected by the status management section is read out; and
a plurality of arithmetic units that perform parallel arithmetic processes on a plurality of sets of input data in a manner compliant with the operation instruction read out from the instruction memory.

2. The parallel arithmetic device according to claim 1, wherein each of the processor elements further includes a plurality of registers that temporarily store the sets of input data, the results of computations performed by the arithmetic units, or intermediate data derived from the arithmetic processes performed by the arithmetic units.

3. The parallel arithmetic device according to claim 1, wherein, when a single set of input data is supplied, one of the arithmetic units included in each of the processor elements performs an arithmetic process on the input data in a manner compliant with the operation instruction read out from the instruction memory.

4. A data processing system comprising:
a data processing device; and
the parallel arithmetic device according to claim 1 in which a circuit is dynamically configured, depending on the situation, in accordance with a state based on the result of output from the data processing device;

wherein the data processing device includes:
a behavioral synthesis section that generates a structural description by unrolling, for behavioral synthesis purposes, a loop description that is included in an operation description and with no data dependency between iterations; and
a layout section that subjects the structural description to logic synthesis and performs a place and route.

5. The data processing system according to claim 4, wherein the parallel arithmetic device dynamically configures a circuit corresponding to an unrolled part of the loop description by using the arithmetic units included in at least one of the processor elements.

6. The data processing system according to claim 4, wherein the behavioral synthesis section divides the loop description with no data dependency between iterations into a first loop description having a number of iterations according to the number of arithmetic units included in each of the processor elements and a second loop description adapted to perform a loop process on the first loop description, and unrolls the first loop description.

7. The data processing system according to claim 4, wherein the behavioral synthesis section performs behavioral synthesis by unrolling an outer loop of a multiple loop having an inner loop as well as the outer loop.

8. The data processing system according to claim 4, wherein the behavioral synthesis section replaces the unrolled part of the loop description with a vector variable and outputs the vector variable as the structural description.

9. A computer-readable medium storing a data processing program for supplying circuit data to a parallel arithmetic device that includes a status management section for selecting one of a plurality of contexts depending on the situation, a plurality of processor elements for determining, in accordance with the context selected by the status management section, arithmetic processing to be performed, and a plurality of switch elements for determining the relation of coupling of each of the processor elements in accordance with the context selected by the status management section, and wherein each of the processor elements includes an instruction memory for memorizing a plurality of operation instructions corresponding respectively to the contexts so that an operation instruction corresponding to the context selected by the status management section is read out, and a plurality of arithmetic units for performing arithmetic processes in parallel on a plurality of sets of input data in a manner compliant with the operation instruction read out from the instruction memory, the computer-readable storage medium storing the data processing program for causing a computer to perform a process comprising the steps of:
performing an behavioral synthesis process to generate a structural description by unrolling, for behavioral synthesis purposes, a loop description that is included in an operation description and with no data dependency between iterations; and
performing a layout process to subject the structural description to logic synthesis, perform a place and route, and generate the circuit data.

10. The computer-readable medium storing the data processing program according to claim 9, wherein the behavioral synthesis process divides the loop description with no data dependency between iterations into a first loop description having a number of iterations according to the number of arithmetic units included in each of the processor elements and a second loop description adapted to perform a loop process on the first loop description, and unrolls the first loop description.

11. The computer-readable medium storing the data processing program according to claim 9, wherein the behavioral synthesis process performs behavioral synthesis by unrolling an outer loop of a multiple loop having an inner loop as well as the outer loop.

12. The computer-readable medium storing the data processing program according to claim 9, wherein the behavioral synthesis process replaces the unrolled part of the loop description with a vector variable and outputs the vector variable as the structural description.

* * * * *